(12) United States Patent
Okada et al.

(10) Patent No.: US 12,051,671 B2
(45) Date of Patent: Jul. 30, 2024

(54) PRESSURE-CONTACT-TYPE SEMICONDUCTOR DEVICE

(71) Applicant: Mitsubishi Electric Corporation, Tokyo (JP)

(72) Inventors: Jun Okada, Tokyo (JP); Tetsuo Motomiya, Tokyo (JP); Kazunori Taguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 558 days.

(21) Appl. No.: 17/293,579

(22) PCT Filed: Jan. 23, 2019

(86) PCT No.: PCT/JP2019/001972
§ 371 (c)(1),
(2) Date: May 13, 2021

(87) PCT Pub. No.: WO2020/152797
PCT Pub. Date: Jul. 30, 2020

(65) Prior Publication Data
US 2022/0005783 A1 Jan. 6, 2022

(51) Int. Cl.
*H01L 23/00* (2006.01)
*H01L 25/07* (2006.01)
*H01L 25/18* (2023.01)

(52) U.S. Cl.
CPC ............ *H01L 24/72* (2013.01); *H01L 25/072* (2013.01); *H01L 25/18* (2013.01); *H01L 2224/72* (2013.01);
(Continued)

(58) Field of Classification Search
CPC ....... H01L 24/72; H01L 25/072; H01L 25/18; H01L 2224/72; H01L 2924/10253;
(Continued)

(56) References Cited

U.S. PATENT DOCUMENTS

2013/0093095 A1 4/2013 Orimoto
2018/0331077 A1* 11/2018 Tamada ............ H01L 23/49517

FOREIGN PATENT DOCUMENTS

CN 103168356 A 6/2013
EP 3 168 873 A1 5/2017
(Continued)

OTHER PUBLICATIONS

International Search Report issued in PCT/JP2019/001972; mailed Mar. 26, 2019.
(Continued)

*Primary Examiner* — Mohammad A Rahman
(74) *Attorney, Agent, or Firm* — Studebaker & Brackett PC (57) ABSTRACT

The present invention has an object to enhance manufacturability of a pressure-contact-type semiconductor device. A pressure-contact-type semiconductor device according to the present invention includes: a semiconductor chip, the semiconductor chip including a guard ring and a gate signal input/output part in the first main surface; a first external electrode being formed on a side of the first main surface of the semiconductor chip; a conductive pattern being formed on the first external electrode; a contact pin connecting the gate signal input/output part and the conductive pattern; a plate-like electrode being provided on the second main surface of the semiconductor chip; a disc spring being provided on the plate-like electrode; and a second external electrode being provided on the disc spring, the second external electrode and the first external electrode interposing the semiconductor chip.

5 Claims, 8 Drawing Sheets

(52) U.S. Cl.
CPC ............... *H01L 2924/10253* (2013.01); *H01L 2924/10254* (2013.01); *H01L 2924/10272* (2013.01); *H01L 2924/1033* (2013.01); *H01L 2924/13055* (2013.01); *H01L 2924/13091* (2013.01)

(58) Field of Classification Search
CPC . H01L 2924/10254; H01L 2924/10272; H01L 2924/1033; H01L 2924/13055; H01L 2924/13091; H01L 23/5386; H01L 23/051; H01L 23/492; H01L 23/4922; H01L 23/4924; H01L 23/4926; H01L 23/4928; H01L 23/043; H01L 23/045; H01L 23/047; H01L 23/049; H01L 24/00–98; H01L 2224/00–98
See application file for complete search history.

(56) References Cited

FOREIGN PATENT DOCUMENTS

| | | |
|---|---|---|
| JP | S56-107561 A | 8/1981 |
| JP | S58-054643 A | 3/1983 |
| JP | S63-95632 A | 4/1988 |
| JP | 2001-230373 A | 8/2001 |

OTHER PUBLICATIONS

An Office Action mailed by the Chinese Patent Office on Jan. 9, 2024, which corresponds to Chinese U.S. Appl. No. 17/293,579.4 and is related to U.S. Appl. No. 17/293,579.

* cited by examiner

PRESSURE-CONTACT-TYPE SEMICONDUCTOR DEVICE

TECHNICAL FIELD

The present invention relates to a pressure-contact-type semiconductor device in which a semiconductor element is pressurized and held by a pair of electrodes.

BACKGROUND ART

A pressure-contact-type semiconductor device includes a semiconductor element, a pair of electrodes that pressurizes and holds the semiconductor element, and a disc spring that subjects the semiconductor element to pressure contact. The diameter of a contact surface of the electrode to face one surface of the semiconductor element is smaller than that of a bevel part of the semiconductor element. The electrode is provided with a hole through which a conductive pipe passes at its center portion, and when the conductive pipe comes into contact with a gate signal input/output part of the semiconductor element, transmission and reception of signals to and from the semiconductor element and an external electrode is enabled (for example, see Patent Document 1).

PRIOR ART DOCUMENTS

Patent Documents

Patent Document 1: Japanese Patent Application Laid-Open No. 58-54643 (1983)

SUMMARY

Problem to be Solved by the Invention

In the conventional pressure-contact-type semiconductor device, the disc spring is provided on a surface including the gate signal input/output part of the semiconductor element, which presents a problem of complexity of the structure and poor manufacturability. The present invention is made in order to solve the problem described above, and has an object to enhance manufacturability of a pressure-contact-type semiconductor device.

Means to Solve the Problem

A pressure-contact-type semiconductor device according to the present invention includes: a semiconductor chip including a first main surface and a second main surface being a surface to face the first main surface, the semiconductor chip including a guard ring and a gate signal input/output part in the first main surface; a first external electrode being formed on a side of the first main surface of the semiconductor chip; a conductive pattern being formed on the first external electrode; a contact pin connecting the gate signal input/output part and the conductive pattern; a plate-like electrode being provided on the second main surface of the semiconductor chip; a disc spring being provided on the plate-like electrode; and a second external electrode being provided on the disc spring, the second external electrode and the first external electrode interposing the semiconductor chip.

Effects of the Invention

In the semiconductor device according to the present invention, the disc spring is provided on the second main surface side on the opposite side of the first main surface including the gate signal input/output part of the semiconductor chip, and therefore manufacturability is enhanced. These and other objects, features, aspects and advantages of the present invention will become more apparent from the following detailed description of the present invention when taken in conjunction with the accompanying drawings.

DESCRIPTION OF EMBODIMENTS

A. First Embodiment

Figure 1:
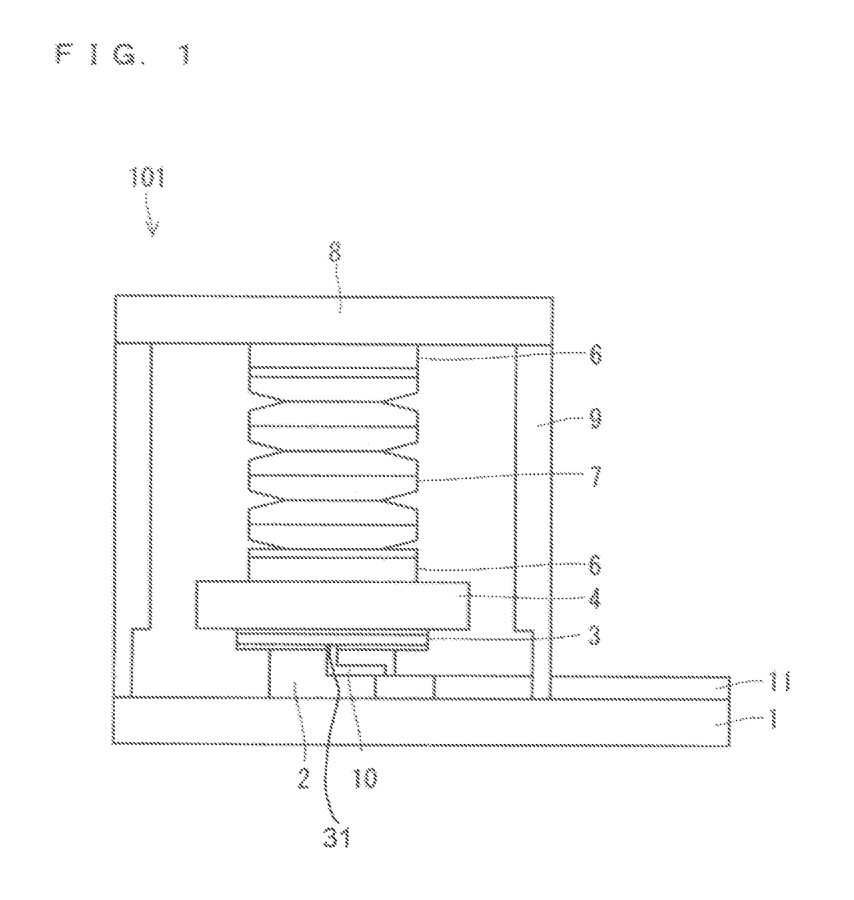
FIG. 1 is a cross-sectional view of a pressure-contact-type semiconductor device according to the first embodiment.
Figure 2:
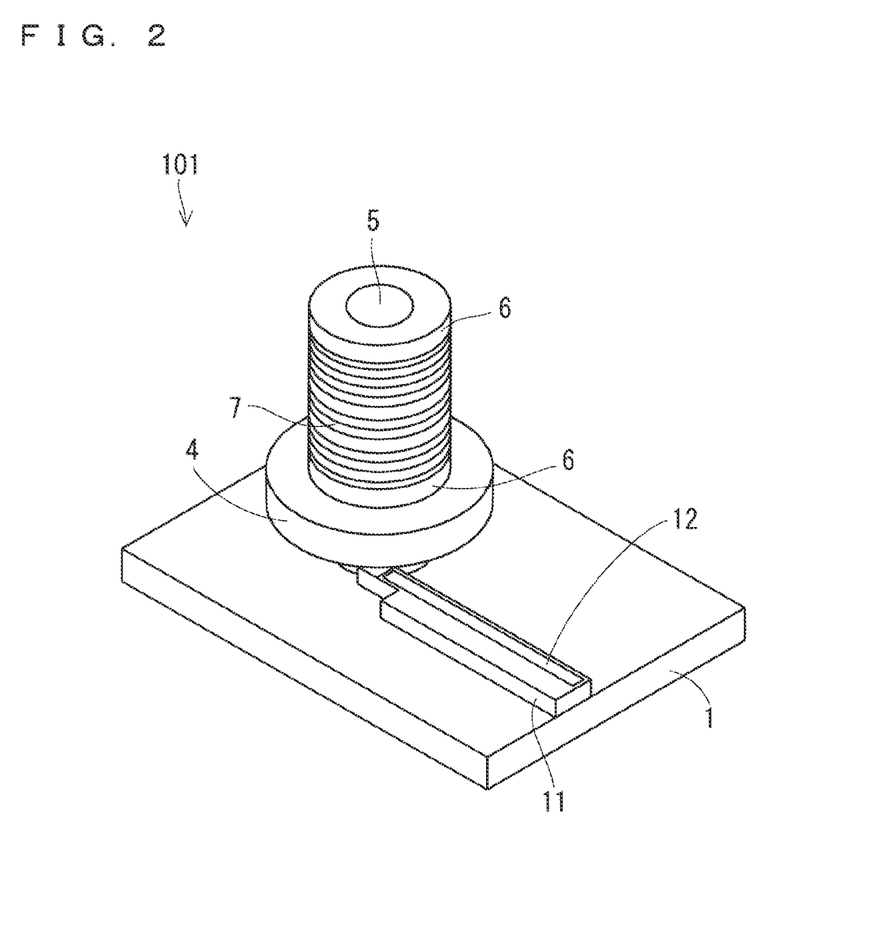
FIG. 2 is a perspective view of the pressure-contact-type semiconductor device according to the first embodiment.

FIG. 1 is a cross-sectional view of a pressure-contact-type semiconductor device 101 according to the first embodiment, and FIG. 2 is a perspective view of the pressure-contact-type semiconductor device 101. Note that, in FIG. 2, illustration of an external electrode 8 and a frame 9 is omitted.

The pressure-contact-type semiconductor device 101 includes an external electrode 1, an electrode block 2, a semiconductor chip 3, a plate-like electrode 4, a support electrode 5, a washer 6, a disc spring 7, an external electrode 8, a frame 9, a contact pin 10, an insulation substrate 11, and a conductive pattern 12. Although FIGS. 1 and 2 illustrate a single semiconductor chip 3, this is merely for the sake of simplicity of description, and a plurality of semiconductor chips may be simultaneously subjected to pressure contact.

The electrode block 2 is joined to the upper surface of the external electrode 1. The semiconductor chip 3 is mounted on the electrode block 2. The lower surface of the semiconductor chip 3 to come into contact with the electrode block 2 is referred to as a first main surface, and the upper surface of the semiconductor chip 3 to face the first main surface is referred to as a second main surface. The lower surface of the semiconductor chip 3 is a guard ring surface including a guard ring (not shown). The plate-like electrode 4 is disposed on the upper surface of the semiconductor chip 3. The area of the lower surface of the plate-like electrode 4 is an area in accordance with the dimensions of the upper surface of the semiconductor chip 3. The support electrode 5 having a cylindrical shape is disposed on the plate-like electrode 4 at a position to overlap the semiconductor chip 3 in plan view. The support electrode 5 serves to support the disc spring 7.

The disc spring 7 is disposed on the plate-like electrode 4 by being supported by the support electrode 5. The washer 6 is disposed at both ends of the disc spring 7. The external electrode 8 is disposed on the washer 6 disposed on the disc spring 7. The external electrode 8 is coupled to the external electrode 1 through the frame 9. With this configuration, the semiconductor chip 3 is subjected to pressure contact from the upper and lower sides by the external electrode 8 and the external electrode 1, so as to be fixed.

The plate-like electrode 4 and the support electrode 5 may be integral with each other. Further, a conductive material for reducing contact resistance may be inserted between the semiconductor chip 3 and the electrode block 2 or between the semiconductor chip 3 and the plate-like electrode 4. Further, the semiconductor chip 3 may be an IGBT or a MOSFET made of Si, or may be a SiC-MOSFET or a SiC-IGBT using a wide-bandgap semiconductor such as SiC. As the wide-bandgap semiconductor, a gallium nitride-based material, diamond, or the like may also be used, in addition to SiC.

The lower surface of the semiconductor chip 3 includes a gate signal input/output part 31, in addition to the guard ring. Specifically, wiring for a gate signal is disposed on the lower surface of the semiconductor chip 3. The gate signal input/output part 31 comes into contact with the conductive pattern 12 on the insulation substrate 11, through the contact pin 10 having spring property. With this configuration, input/output of the gate signal of the semiconductor chip 3 is implemented. In FIG. 1, a part of the lower surface of the semiconductor chip 3 to come into contact with the contact pin 10 corresponds to the gate signal input/output part 31. In FIG. 1, the gate signal input/output part 31 is formed at the center portion of the lower surface of the semiconductor chip 3.

As described in the above, the pressure-contact-type semiconductor device 101 according to the first embodiment includes: the semiconductor chip 3 including the first main surface and the second main surface being the surface to face the first main surface, the semiconductor chip 3 including the guard ring and the gate signal input/output part 31 in the first main surface; the first external electrode 1 being formed on the side of the first main surface of the semiconductor chip 3; the conductive pattern 12 being formed on the first external electrode 1; the contact pin 10 connecting the gate signal input/output part 31 and the conductive pattern 12; the plate-like electrode 4 being provided on the second main surface of the semiconductor chip 3; the disc spring 7 being provided on the plate-like electrode 4; and the second external electrode 8 being provided on the disc spring 7, the second external electrode 8 and the first external electrode 1 interposing the semiconductor chip 3. The pulling out of the gate wiring is performed from the lower surface of the semiconductor chip 3, whereas the disc spring 7 is disposed on the upper surface side of the semiconductor chip 3. The gate signal input/output part 31 and the disc spring 7 are separated across the semiconductor chip 3, which forestalls contact therebetween. With this configuration, the ease of assembly is enhanced, and wiring design is facilitated.

Further, the disc spring 7 is disposed on the upper surface side, which is the opposite of the lower surface including the guard ring of the semiconductor chip 3. If the disc spring 7 is disposed on the lower surface side including the guard ring of the semiconductor chip 3, in the IGBT or the MOSFET, pressure contact can be performed only in the area except for guard ring due to insulation, and thus only the disc spring of a size in accordance with the area thereof can be disposed. In contrast, in the pressure-contact-type semiconductor device 101, the disc spring 7 of a size in accordance with the area of the semiconductor chip 3 can be disposed, with no limitation being imposed due to the guard ring and the gate signal input/output part 31.

Further, since the distance between the gate signal input/output part 31 and the external electrode 1 is short, the wiring length in the height direction can be reduced, which reduces wiring inductance to the minimum and facilitates removal of the gate signal to the outside. This effect is greater in the semiconductor device using a plurality of semiconductors.

B. Second Embodiment

Figure 3:
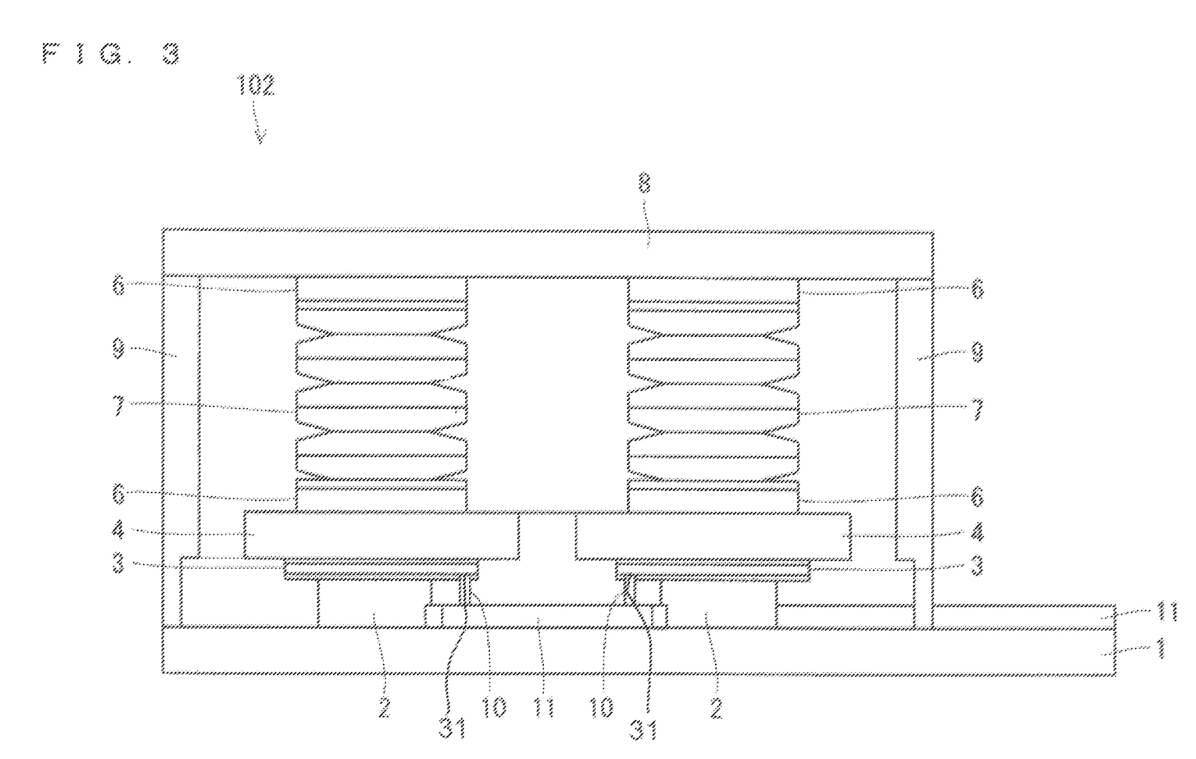
FIG. 3 is a cross-sectional view of a pressure-contact-type semiconductor device according to the second embodiment.
Figure 4:
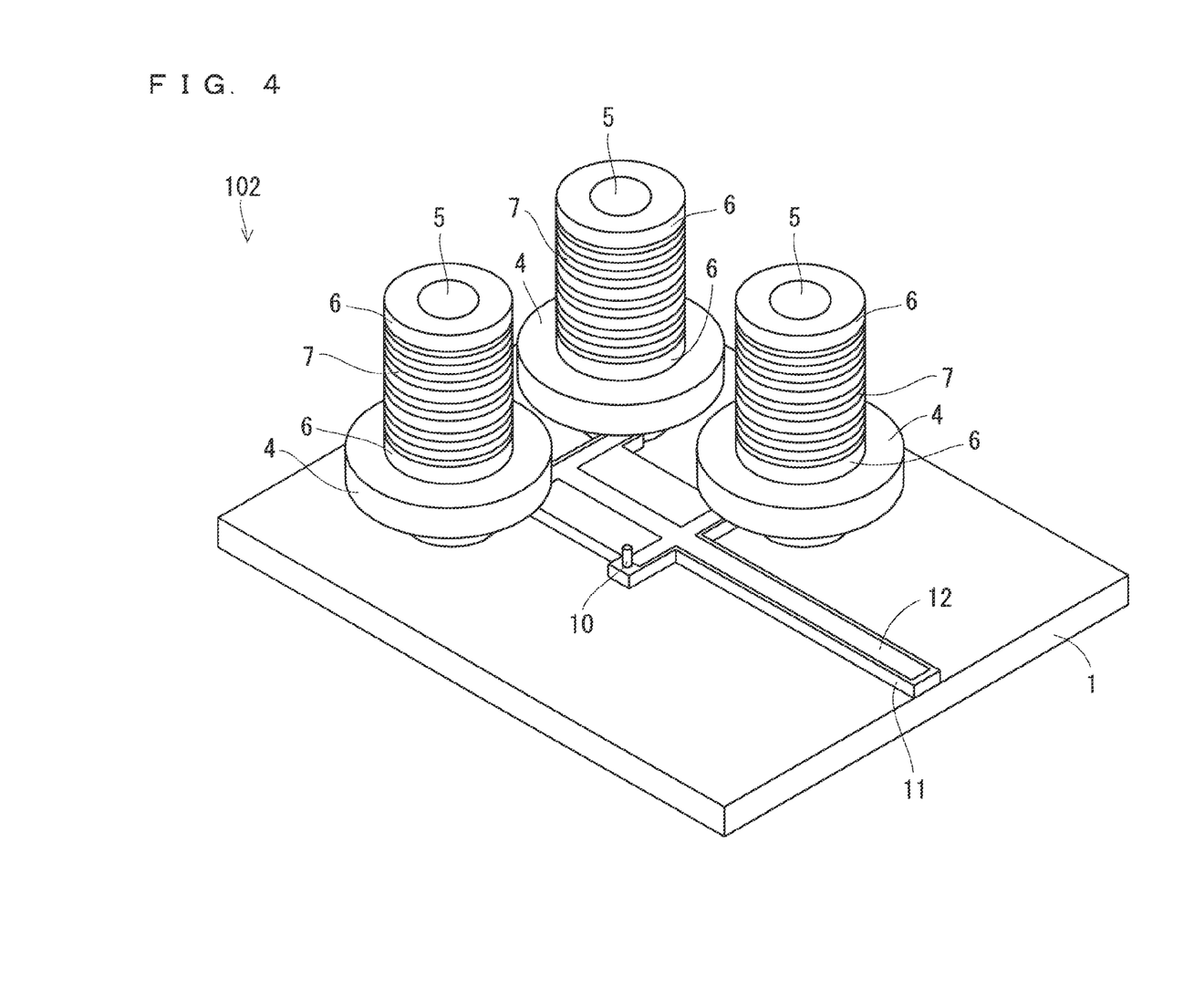
FIG. 4 is a perspective view of the pressure-contact-type semiconductor device according to the second embodiment.

FIG. 3 is a cross-sectional view of a pressure-contact-type semiconductor device 102 according to the second embodiment, and FIG. 4 is a perspective view of the pressure-contact-type semiconductor device 102. Note that, in FIG. 4, illustration of an external electrode 8 and a frame 9 is omitted.

In the pressure-contact-type semiconductor device 101 according to the first embodiment, the gate signal input/output part 31 is provided at the center portion of the lower surface of the semiconductor chip 3. In the pressure-contact-type semiconductor device 102, by contrast, the gate signal input/output part 31 is provided at the end portion of the lower surface being the first main surface of the semiconductor chip 3. The configuration of the pressure-contact-type semiconductor device 102 other than that mentioned above is similar to that of the pressure-contact-type semiconductor device 101. The configuration in which the gate signal input/output part 31 is provided at the end portion of the lower surface of the semiconductor chip 3 makes it easier to connect each gate signal input/output part 31 to a common conductive pattern 12 when a plurality of semiconductor chips 3 are used by placing the plurality of semiconductor chips 3 in order, as illustrated in FIG. 4.

C. Third Embodiment

Figure 5:
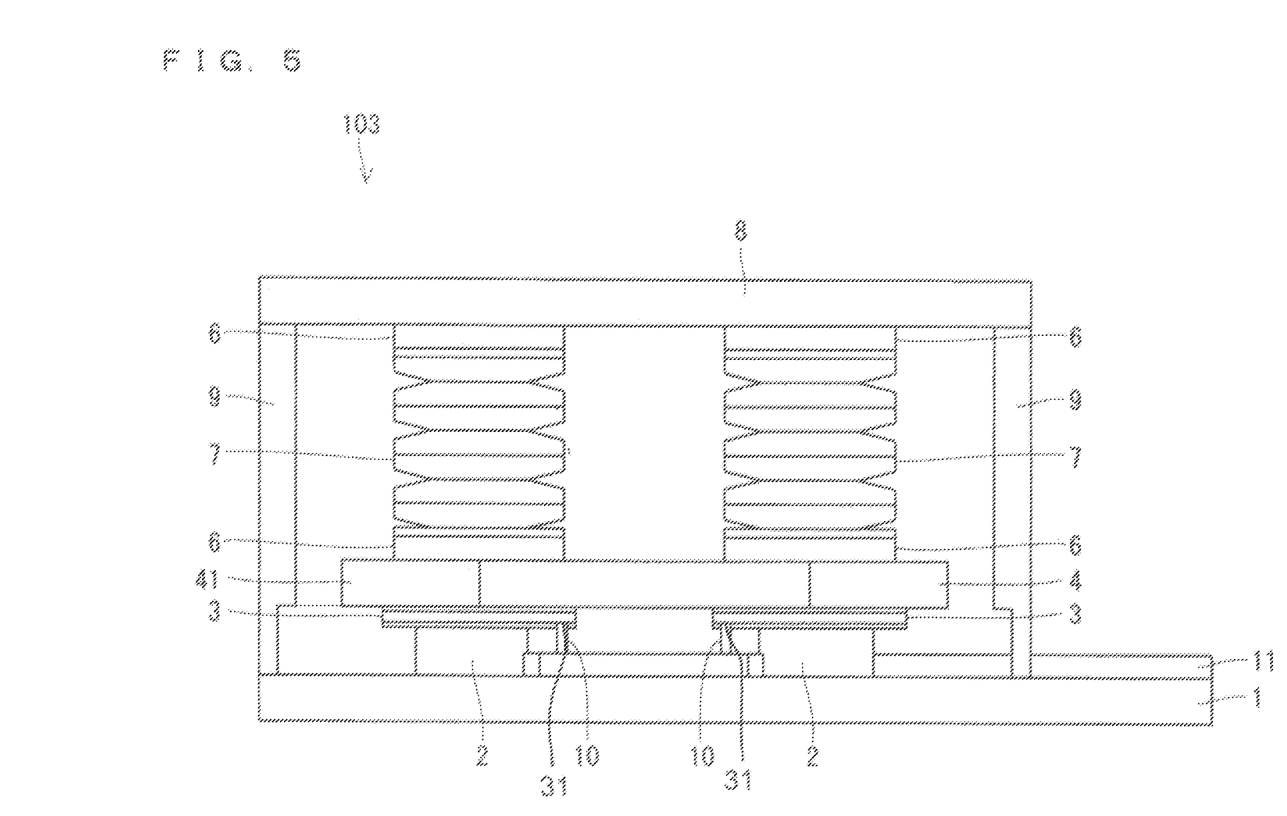
FIG. 5 is a cross-sectional view of a pressure-contact-type semiconductor device according to the third embodiment.
Figure 6:
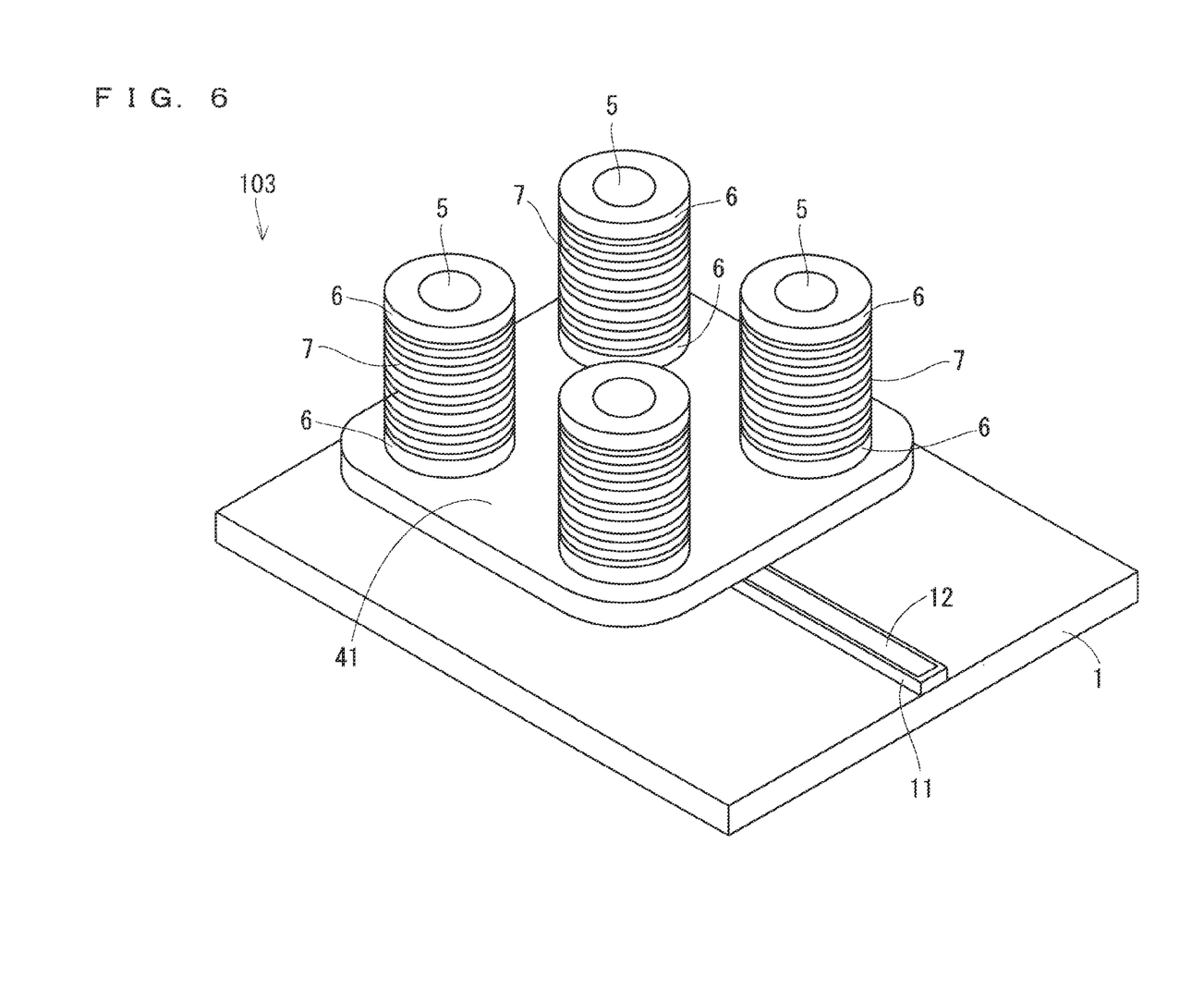
FIG. 6 is a perspective view of the pressure-contact-type semiconductor device according to the third embodiment.

FIG. 5 is a cross-sectional view of a pressure-contact-type semiconductor device 103 according to the third embodiment, and FIG. 6 is a perspective view of the pressure-contact-type semiconductor device 103. Note that, in FIG. 6, illustration of an external electrode 8 and a frame 9 is omitted. In comparison to the pressure-contact-type semiconductor device 102 according to the second embodiment, the pressure-contact-type semiconductor device 103 includes a plate-like electrode 41 instead of the plate-like electrode 4.

The area of the main surface of the plate-like electrode 41 is larger than the area of the upper surface being the second main surface of the semiconductor chip 3 to come into contact with the plate-like electrode 41. With this configuration, as illustrated in FIG. 5 and FIG. 6, the plate-like electrode 41 may be shared by a plurality of adjacent semiconductor chips 3. Owing to the area of the main surface of the plate-like electrode 41 being larger than the area of the upper surface of the semiconductor chip 3, high heat dissipation can be achieved.

D. Fourth Embodiment

Figure 7:
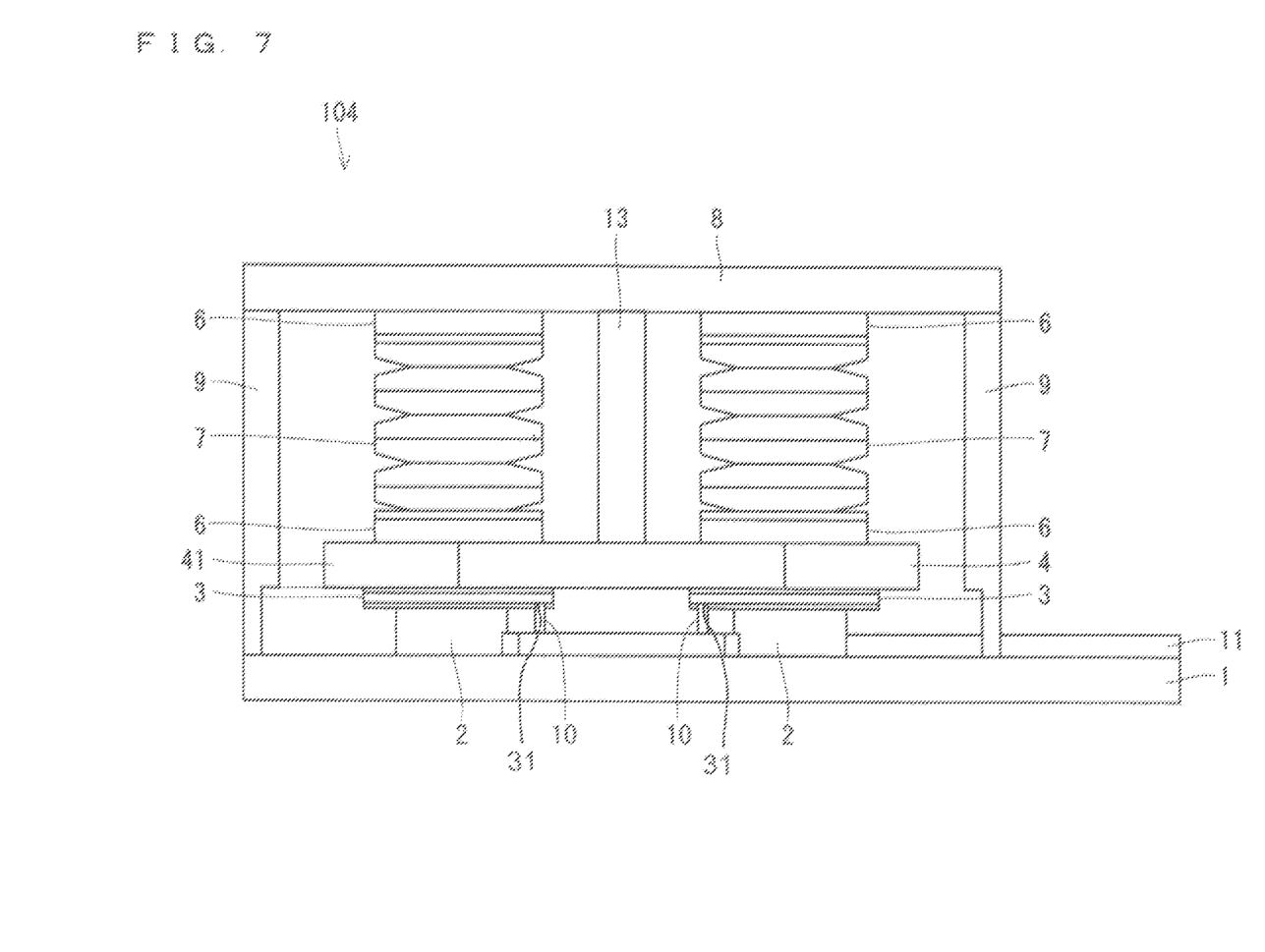
FIG. 7 is a cross-sectional view of a pressure-contact-type semiconductor device according to the fourth embodiment.
Figure 8:
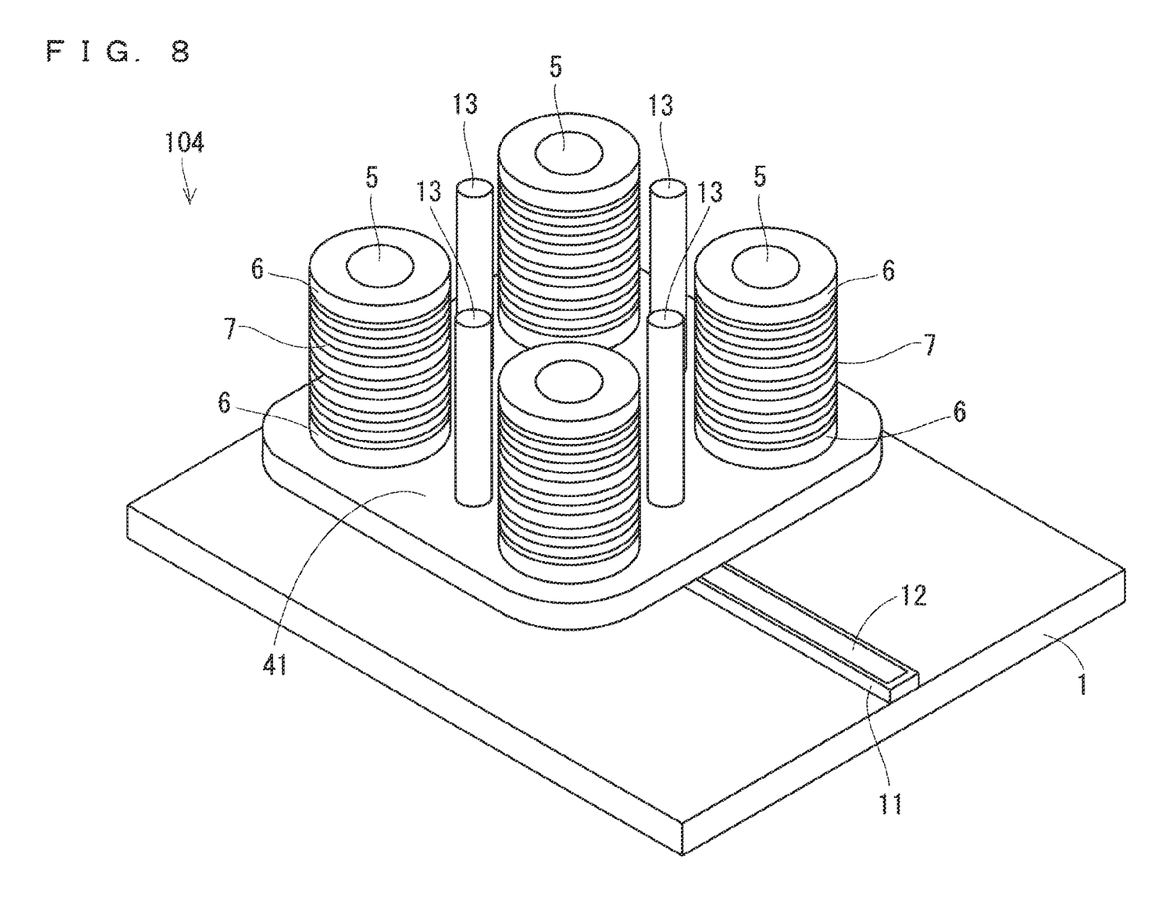
FIG. 8 is a perspective view of the pressure-contact-type semiconductor device according to the fourth embodiment.

FIG. 7 is a cross-sectional view of a pressure-contact-type semiconductor device 104 according to the fourth embodiment, and FIG. 8 is a perspective view of the pressure-contact-type semiconductor device 104. Note that, in FIG. 8, illustration of an external electrode 8 and a frame 9 is omitted. The pressure-contact-type semiconductor device 104 includes a coupling member 13, in addition to the configuration of the pressure-contact-type semiconductor device 103 according to the third embodiment. The coupling member 13 uses, as its main material, for example, a material having high thermal conductivity such as aluminum, copper, silver, gold, or molybdenum, and connects the external electrode 8 and the plate-like electrode 4 having the same potential with each other. The coupling member 13 allows heat generated from the semiconductor chip 3 to transfer to the external electrode 1, thus enabling efficient heat dissipation from the external electrode 1.

Note that, in the present invention, each embodiment can be freely combined and each embodiment can be modified or omitted as appropriate within the scope of the invention. While the present invention has been shown and described in detail, the foregoing description is in all aspects illustrative and not restrictive. It is therefore understood that numerous unillustrated modifications can be devised without departing from the scope of the present invention.

EXPLANATION OF REFERENCE SIGNS

1, 8 external electrode, 2 electrode block, 3 semiconductor chip, 4, 41 plate-like electrode, 5 support electrode, 6 washer, 7 disc spring, 9 frame, 10 contact pin, 11 insulation substrate, 12 conductive pattern, 13 coupling member, 101 to 104 pressure-contact-type semiconductor device

The invention claimed is:

1. A pressure-contact-type semiconductor device comprising:
   a semiconductor chip including a first main surface and a second main surface being a surface to face the first main surface, the semiconductor chip including a gate signal input/output part in the first main surface;
   a first external electrode being formed on a side of the first main surface of the semiconductor chip;
   a conductive pattern being formed on the first external electrode;
   a contact pin connecting the gate signal input/output part and the conductive pattern;
   a plate-like electrode being provided on the second main surface of the semiconductor chip;
   a disc spring being provided on the plate-like electrode; and
   a second external electrode being provided on the disc spring, the second external electrode and the first external electrode interposing the semiconductor chip.

2. The pressure-contact-type semiconductor device according to claim 1, wherein
   the gate signal input/output part is provided at an end portion of the first main surface of the semiconductor chip.

3. The pressure-contact-type semiconductor device according to claim 1, wherein
   an area of a main surface of the plate-like electrode is larger than an area of the second main surface of the semiconductor chip.

4. The pressure-contact-type semiconductor device according to claim 1, further comprising
   a coupling member connecting the plate-like electrode and the second external electrode, wherein
   the coupling member uses, as a main material, aluminum, copper, silver, gold, or molybdenum.

5. The pressure-contact-type semiconductor device according to claim 1, wherein
   the semiconductor chip is a semiconductor chip using a wide-bandgap semiconductor.

* * * * *